(12) United States Patent
Shenoy

(10) Patent No.: US 7,034,532 B1
(45) Date of Patent: Apr. 25, 2006

(54) DRIVEN EQUILIBRIUM AND FAST-SPIN ECHO SCANNING

(75) Inventor: Rajendra K. Shenoy, Dixhills, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 11/056,082

(22) Filed: Feb. 10, 2005

Related U.S. Application Data

(63) Continuation of application No. 09/769,446, filed on Jan. 26, 2001, now abandoned.

(51) Int. Cl.
*G01V 3/00* (2006.01)

(52) U.S. Cl. ...................... 324/309; 324/307

(58) Field of Classification Search ............ 324/309, 324/307, 300, 318, 319, 322; 600/410
See application file for complete search history.

(56) References Cited

U.S. PATENT DOCUMENTS

| | | | | |
|---|---|---|---|---|
| 5,883,558 A * | 3/1999 | Laskaris et al. | ............ | 335/216 |
| 6,219,571 B1 * | 4/2001 | Hargreaves et al. | ........ | 600/410 |
| 6,799,066 B1 * | 9/2004 | Steines et al. | ............... | 600/407 |
| 6,842,000 B1 * | 1/2005 | Norris et al. | ............... | 324/309 |
| 6,847,209 B1 * | 1/2005 | Shenoy et al. | ............... | 324/309 |
| 2002/0087274 A1 * | 7/2002 | Alexander et al. | ............ | 702/19 |

* cited by examiner

*Primary Examiner*—Brij B. Shrivastav
(74) *Attorney, Agent, or Firm*—IP Strategies

(57) ABSTRACT

An NMR imaging process utilizes application of both a driven equilibrium technique and a fast-spin echo technique to acquire image. The fast-spin echo technique is a multi-echo NMR imaging sequence, where different echoes are encoded differently to fill the ($k_x$, $k_g$) space at a speed of 1/n of the single echo speed, where n is the number of echoes in the multiecho sequence. During this echo train, a 90-degree RF pulse applied with proper phase at the center of any echo turns the magnetization back in the direction of the static magnetic field. Within a short waiting time after the 90-degree RF pulse, the spins are ready to be excited again. The multi-echo sequence has one 90-degree RF pulse at the beginning, followed by a series of n 180-degree RF pulses, followed by n echoes. A second 90-degree RF pulse is turned on exactly at the center of the nth echo, which returns all the magnetization left at this time to the static field direction. Only one frequency is used for excitation in acquiring the NMR signal in the single slice mode. Gradients are adjusted for oblique scanning. In the multislice acquisition mode, RF phases of different slices are different from one another and the final images can be constructed either by sharing the $k_g$ space or by using a transform process to separate the slices.

70 Claims, 4 Drawing Sheets

DRIVEN EQUILIBRIUM AND FAST-SPIN ECHO SCANNING

CROSS-REFERENCE TO RELATED APPLICATION

This is a continuation of U.S. patent application Ser. No. 09/769,446, which was filed on Jan. 26, 2001 now abandoned.

FIELD OF THE INVENTION

In general, the present invention relates to methods of performing nuclear magnetic resonance (NMR) imaging. In particular, the present invention is a method of reducing the scan time in performing NMR imaging by utilizing driven equilibrium and fast-spin echo techniques.

BACKGROUND OF THE INVENTION

Magnetic resonance imaging (MRI) is one of the most versatile and fastest growing modalities in medical imaging. Since the discovery by Dr. Raymond Damadian in the early 1970s that nuclear magnetic resonance techniques can be used to scan the human body to yield useful diagnostic information, medical NMR imaging devices have been developed for obtaining NMR images of the internal structures of patients. Subsequently, much effort has been expended to improve and refine the techniques used for obtaining NMR images, as well as to determine the diagnostic utility of NMR images. As a result, NMR imaging, or magnetic resonance imaging, as it is sometimes known, has today proven to be an extremely useful tool in the medical community for the purposes of detecting and diagnosing abnormalities within the body.

Conventional magnetic resonance imaging techniques generally employ pulsed magnetic field gradients to spatially encode NMR signals from various portions of an anatomical region of interest. The pulsed magnetic field gradients, together with radio frequency excitation of the nuclear spins and acquisition of signal information, are commonly referred to as a pulse sequence.

The basic science behind NMR imaging is as follows. Pulsed current through a set of conductors will produce a magnetic field external to the conductors; the magnetic field generally has the same time course of development as the current in the conductors. The conductors may be distributed in space to produce three orthogonal gradients X, Y, and Z. Each of the gradients may be independently pulsed by a separate time-dependent current waveform.

In order to construct images from the collection of NMR signals, conventional NMR imaging equipment generally utilizes magnetic field gradients for selecting a particular slice or plane of the object to be imaged and for encoding spatial information into the NMR signals. For example, one conventional technique involves subjecting an object to a continuous static homogenous field extending along a first direction, and to sets of sequences of orthogonal magnetic field gradients. Each set of orthogonal magnetic field gradient sequences generates a magnetic field component in the same direction as the static field, but the sequences have strengths that vary along the direction of the gradients.

Generally, the NMR phenomenon occurs in atomic nuclei having an odd number of protons and/or neutrons. Due to the spins of the protons and neutrons, each such nucleus exhibits a magnetic moment. As a result, when a sample composed of such nuclei is placed in the homogeneous magnetic field, a greater number of nuclear magnetic moments align with the direction of the magnetic field to produce a net macroscopic magnetization in the direction of the field. Under the influence of the magnetic field, the magnetic moments precess about the axis of the field at a frequency that is dependent upon the strength of the applied magnetic field and on the characteristics of the nuclei. The angular precession frequency, $\omega$, also referred to as the Larmor frequency, is given by the equation $\omega=\gamma B$ where $\gamma$ is the gyro-magnetic ratio (which is a constant for each particular atomic nucleus) and B is the strength of the magnetic field acting upon the nuclear spins.

When a substance such as human tissue is subjected to a uniform magnetic field (polarizing field $B_0$), the individual magnetic moments of the spins in the tissue attempt to align with this polarizing field, but the randomly oriented magnetic components in the perpendicular (transverse) plane (X-Y plane) cancel one another. If, however, the tissue is also subjected to a magnetic field (excitation field $B_1$) that is in the X-Y plane and that is at the Larmor frequency, the net aligned moment, M, may be rotated, or "tipped", into the X-Y plane to produce a net transverse magnetic moment $M_t$. $M_t$ rotates, or spins, in the X-Y plane at the Larmor frequency. The practical value of thus phenomenon resides in the signal that is emitted by the excited spins after the excitation field $B_1$ is removed.

Thus, the orientation of the moment (also known as the magnetization) M can be perturbed by the application of a magnetic field oscillating at the Larmor frequency, which has the effect of rotating the magnetization away from the direction of the static field. Typically, the oscillating magnetic field is applied in a direction orthogonal to the direction of the static magnetic field by means of a radio frequency (RF) pulse through coils connected to a radio frequency transmitting apparatus. In essence, the net magnetic vector or orientation of magnetization M is rotated away from the direction of the static field. One typical RF pulse is that which has either sufficient magnitude or duration to rotate the magnetization M into a transverse plane (that is, 90 degrees from the direction of the static field) and thus is known as a 90-degree RF pulse. Similarly, if the magnitude or duration of the RF pulse is selected to be twice that of a 90-degree pulse, the magnetization M will change direction 180 degrees from the main or static magnetic field, and the excitation pulse is called a 180-degree RF pulse.

Accordingly, a typical imaging procedure involves the use of three orthogonal magnetic field gradients, X, Y, and Z, which are pulsed coordinately along with bursts of radio frequency energy. For example, the Z gradient is pulsed on for two brief time periods. A 90-degree radio frequency pulse in the first time period and a 180-degree radio frequency pulse in the second time period are used to select a slice of the anatomy of interest, and to induce the nuclear spin system within that slice to generate an NMR signal. Once the slice is selected by the Z gradient, the two remaining orthogonal gradients are used to confer spatial encoding on the NMR signal in the two orthogonal directions. For example, the Y gradient will encode on the basis of phase advances imparted on a series of :signal responses by using a pulsed gradient waveform of progressively increasing area. The X gradient, which is pulsed on during the signal collection period, will frequency-encode the NMR signal in the third orthogonal direction.

When the RF excitation pulse is stopped (by turning the RF transmitter off), the nuclear spins tend to slowly realign or relax back to the equilibrium position. At this time, the spins emit an NMR signal, which can be detected with an RF receiver coil (which may be, and often is, the same coil as that used with the transmitter). The emitted NMR signal is dependent on three basic parameters, namely, the density of the excited nuclei, the spin-lattice (longitudinal) relaxation time (T1), and the spin-spin (transverse) relaxation time (T2). The latter two parameters are both exponential time constants that characterize the rate of return to equilibrium of the longitudinal and transverse magnetization components following the application of the perturbing RF pulse. These NMR: parameters of spin density, T1, and T2 are related to the atomic nuclei subjected to the NMR phenomenon.

In accordance with this technique, nuclear spins in a selected plane are excited by a selective RF pulse, in the presence of one of the magnetic field gradients. The frequency of the selective RF pulse corresponds to the Larmor frequency for only the selected plane or the object as determined by the magnetic field gradient imposed on the static magnetic field. The applied magnetic field gradient is designated as the slice selection gradient. The selected plane will therefore extend in a direction perpendicular to the gradient direction of the slice selection magnetic field gradient. The selected spins are then subjected to the other magnetic field gradients (which can be designated as the read out and phase-encoding magnetic field gradients). A plurality of repetitions are utilized in which the amplitude of the phase:-encoding gradient is varied for each repetition and in which the read out gradient is applied during the reading out of the generated NMR signals.

The NMR signal is processed to yield images that give an accurate representation of the anatomical features in the selected slice, as well as provide excellent soft tissue contrast. NMR signals may be processed using various algorithms, depending upon the precise nature of the data acquisition procedure. However, all methods employed rely on the ability to spatially encode the signal information by making use of the magnetic field gradients, which are time modulated and sequentially pulsed in various modes to effect the desired result.

For example, the received NMR signals may be transformed by utilizing, for example, conventional two-dimensional Fourier transform techniques. The read out magnetic field and phase-encoding magnetic field gradients encode spatial information into the collection of NMR signals so that two-dimensional images of the NMR signals in the selected plane can be constructed. During the scanning sequence, the various magnetic field gradients are repeatedly switched on and off at the desired intervals.

Many NMR imaging schemes rely on a collection of spin-echo NMR signals. In utilizing spin-echo signals, a 90-degree RF excitation pulse is followed by the application of a 180-degree rephasing RF pulse at a predetermined time interval after the 90-degree pulse. This produces a spin-echo signal at a corresponding time interval after the application of the 180-degree RF pulse. In NMR parlance, the time that the spin-echo NMR signal is produced after the 90-degree RF excitation pulse is designated as TE (for time of echo). Thus, the 180-degree RF pulse is applied at a time interval of TE/2 after the 90-degree RF pulse.

In the application of NMR principles to medicine and medical diagnostic imaging of live human subjects, NMR signals are obtained for a multitude of small areas in a patient, known as picture elements or pixels. The pixels are used to construct an image or pictorial representation of a particular area of the patient being examined. More particularly, the intensity of the NMR signals is measured for the multitude of pixels. The intensity of each signal is a complex function of the tissue-related parameters used in gathering the image information.

For example, it is known that variations in the relaxation times T1 and T2 are closely associated with the differences between healthy and diseased tissue, and thus, from a diagnostic viewpoint, images that display or show significant T1 and/or T2 contrast have proven to be of great diagnostic interest. Unfortunately, in conventional techniques for obtaining both T1-weighted data and T2-weighted data, not only are separate scans required for obtaining T1-weighted and T2-weighted images, but further, additional T1-weighted stains are required to obtain T1-weighted images for the same number of slices for which T2-weighted scans are obtained. This increases the number of scans of the patient that must be performed and the time necessary to complete such scans. After each imaging scan that is performed on a patient, it is generally necessary to allow the patient to rest. Also, a certain amount of time is necessary when conducting a scan for operator setup, loading information into the apparatus with respect to the conditions and sequencing for collection of data, etc. Therefore, in order to obtain, using conventional techniques, T2-weighted images for a plurality of planes and a corresponding number of T1-weighted images, the total scanning time is quite long. It is apparent that one of the major problems with medical NMR imaging is patient throughput. Thus, numerous efforts have been devoted to the development of techniques for obtaining images in a shorter period of time.

Although various efforts have been devoted to the development of techniques for shortening the scan times, to date, they have generally resulted in a sacrifice of the diagnostic quality of the information obtained, and thus, have not yet proven satisfactory.

One factor contributing to the length of an imaging time period is the period of time required for the return of the nuclear magnetizations to equilibrium prior to the :subsequent excitation. A method that has been used to shorten this time period is known as the driven equilibrium pulse technique. In typical driven equilibrium techniques utilized with spin echo sequences, spins in the X-Y plane are driven back to alignment with the Z-axis in order to shorten the time period required for the spins to return to equilibrium. As a result, the data acquisition time is shortened, and image contrasts may be manipulated in pulse sequences at a high repetition rate.

However, driven equilibrium techniques have not become a standard on a clinical scanner. A major problem with conventional driven equilibrium techniques is the resulting lack of contrast control in the derived image. Some of the difficulty may be related to eddy current control and RF phase control in MRI scanners. That is, in order to obtain accurate imaging data using the driven equilibrium technique, it is important that all the spins in the selected slice are precisely in phase, and that the 90-degree Z-restoring pulse is delivered along an axis that is exactly perpendicular to the direction along which the transverse magnetization is focused. Even small deviations in these parameters caused by eddy currents generated by the gradients are enough to seriously degrade the amount of magnetization restored to the Z-axis.

Another technique for decreasing the scan and image capture time of an NMR imaging procedure is the use of fast-spin echo methods. Such methods involve the acquisition of multiple spin echo signals from a single excitation pulse in which each acquired echo signal is separately phase-encoded. Each pulse sequence therefore results in the acquisition of a plurality of views, and a plurality of pulse sequences is typically utilized to acquire a complete set of image data. However, using such techniques, although the TE time interval can be varied, the repetition rate is that same for each produced image, thereby precluding the generation of truly T1-weighted images.

Accordingly, a significant need exists for shortening the time period for obtaining the T1-weighted and T2-weighted images, and in particular, to reduce the total acquisition time for acquiring the data and information from which T1-weighted and T2-weighted NMR images are constructed.

SUMMARY OF THE INVENTION

It is therefore an objective of the present invention to provide a reduced scanning and image data collection time for NMR imaging, without sacrificing image quality.

The present invention is an NMR imaging process. The process includes subjecting the imaging object to a uniform polarizing magnetic field, applying orthogonal magnetic field gradients to the imaging object, applying RF energy to the imaging object according to a fast-spin echo technique, and subsequently applying RF energy to the imaging object according to a driven equilibrium technique. According to this process, a nuclear magnetic resonance signal emitted by the imaging object may be detected, and the nuclear magnetic resonance signal may be processed to provide imaging data. Preferably, the fast-spin echo technique includes application of a multi-echo NMR imaging sequence. The multi-echo NMR imaging sequence includes a plurality of different echoes, and each of the plurality of different echoes is encoded differently, or at least one echo is encoded differently than another echo. A 90-degree RF pulse is applied at the center of any of the plurality of different echoes. The applied 90-degree RF pulse has a phase such that magnetization of the imaging object is oriented in the direction of the uniform polarizing magnetic field.

According to another aspect of the present invention, an NMR imaging process includes subjecting the imaging object to a uniform polarizing magnetic field and applying orthogonal magnetic field gradients to the imaging object. A first 90-degree RF excitation pulse is applied, followed by a sequence of 180-degree RF excitation pulses, which in turn is followed by a second 90-degree RF excitation pulse. The process may also further include detecting a nuclear magnetic resonance signal emitted by the imaging object and processing the nuclear magnetic resonance signal to provide imaging data. Each of the 180-degree RF excitation pulses in the sequence generates a spin echo, and each spin echo precedes a next 180-degree RF excitation pulse in the sequence. Preferably, the second 90-degree RF excitation pulse is applied at a center of the spin echo generated by a last 180-degree RF excitation pulse in the sequence. Each spin echo may be encoded differently, or at least one spin echo is encoded differently than another spin echo. The second 90-degree; RF excitation pulse has a phase such that magnetization of the imaging object is forced in the direction of the uniform polarizing magnetic field.

Thus, the multi-echo NMR imaging sequence preferably includes a first 90-degree RF pulse followed by a series of 180-degree RF pulses. The series of 180-degree RF pulses includes n 180-degree pulses, which are followed by n echoes. A second 90-degree RF pulse is applied at a center of the nth echo, such that magnetization of the imaging object is oriented in the direction of the uniform polarizing magnetic field. According to the described method, the fast-spin echo technique provides for acquisition of multiple spin echo signals from a single excitation pulse, and spins are driven back to alignment with the polarizing field. Accordingly, image data is acquired more rapidly during a scan, and the time period between scans is reduced.

BRIEF DESCRIPTION OF THE DRAWINGS

The present invention may be more clearly understood by way of the following written description, appended claims, and drawings, in which:

DETAILED DESCRIPTION OF THE INVENTION

Figure 1A:
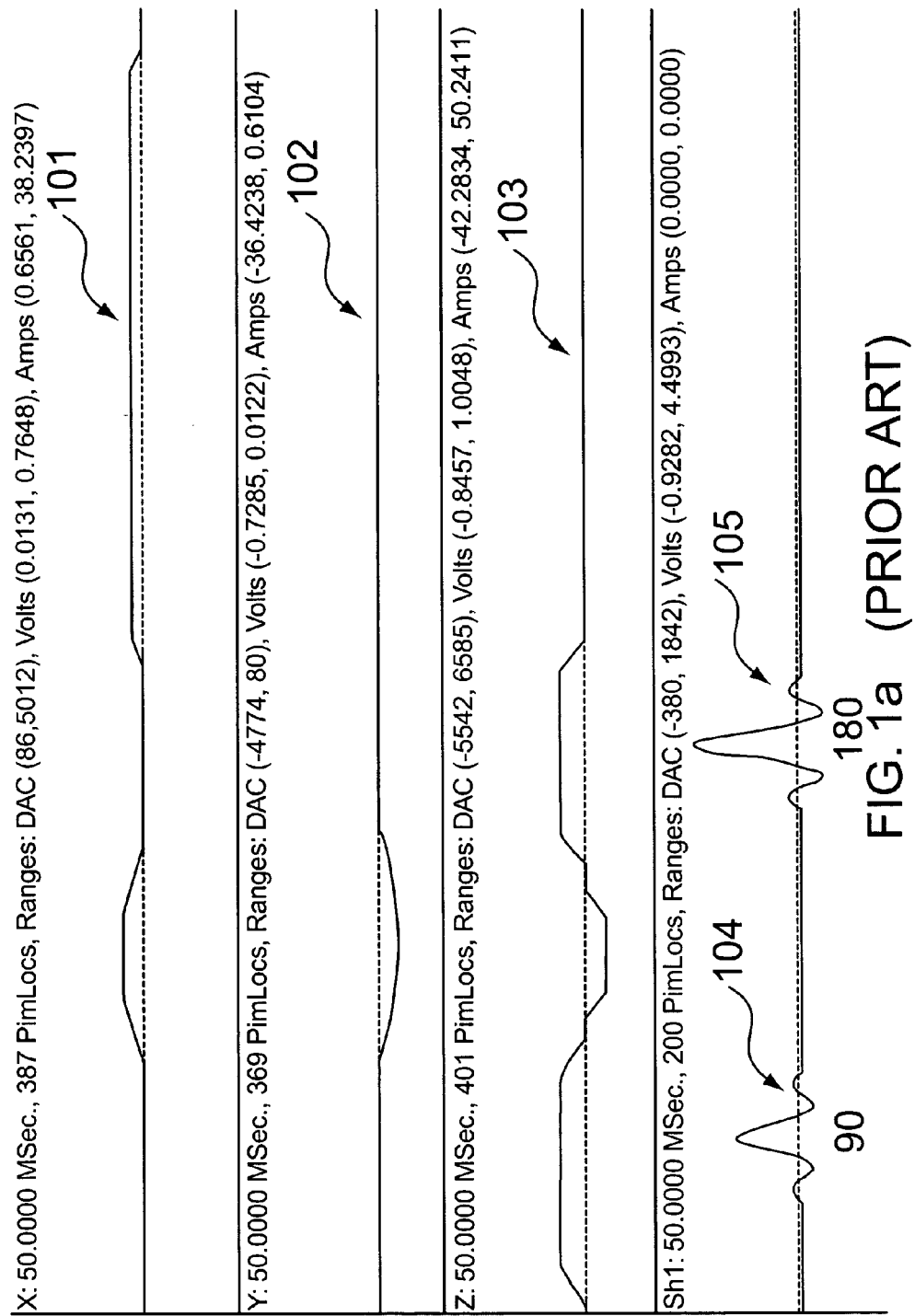
FIG. 1a shows the timed application of RF and gradient pulses in a conventional/standard spin echo MRI scheme.

As noted above, in a conventional spin echo imaging process, data is collected following the 180-degree RF pulse. Prior to each acquisition, the phase-encoding gradient is stepped according to the conventional spin warp imaging technique. The imaging data corresponding to each step of phase-encoding gradient represents a line in the k-space ($k_x$, $k_y$). Once the k-space is filled, a two-dimensional Fourier transform would provide the necessary information to reconstruct an image. A single spin echo pulse sequence is shown in FIG. 1a. As shown, the sequence includes X, Y, and Z gradients 101, 102, 103, and 90-degree and 180-degree RF pulses 104, 105. The single echo sequence can be expanded to a multi-echo sequence by adding a number of subsequent 180-degree pulses. The time gap between the 180-degree pulses is twice that between the 90-degree pulse and the first 180-degree pulse. This train of 180-degree pulses produces echoes at the center of those RF pulses. The T2 dependence of these echoes can be used to produce a number of images having different contrasts.

Figure 1B:
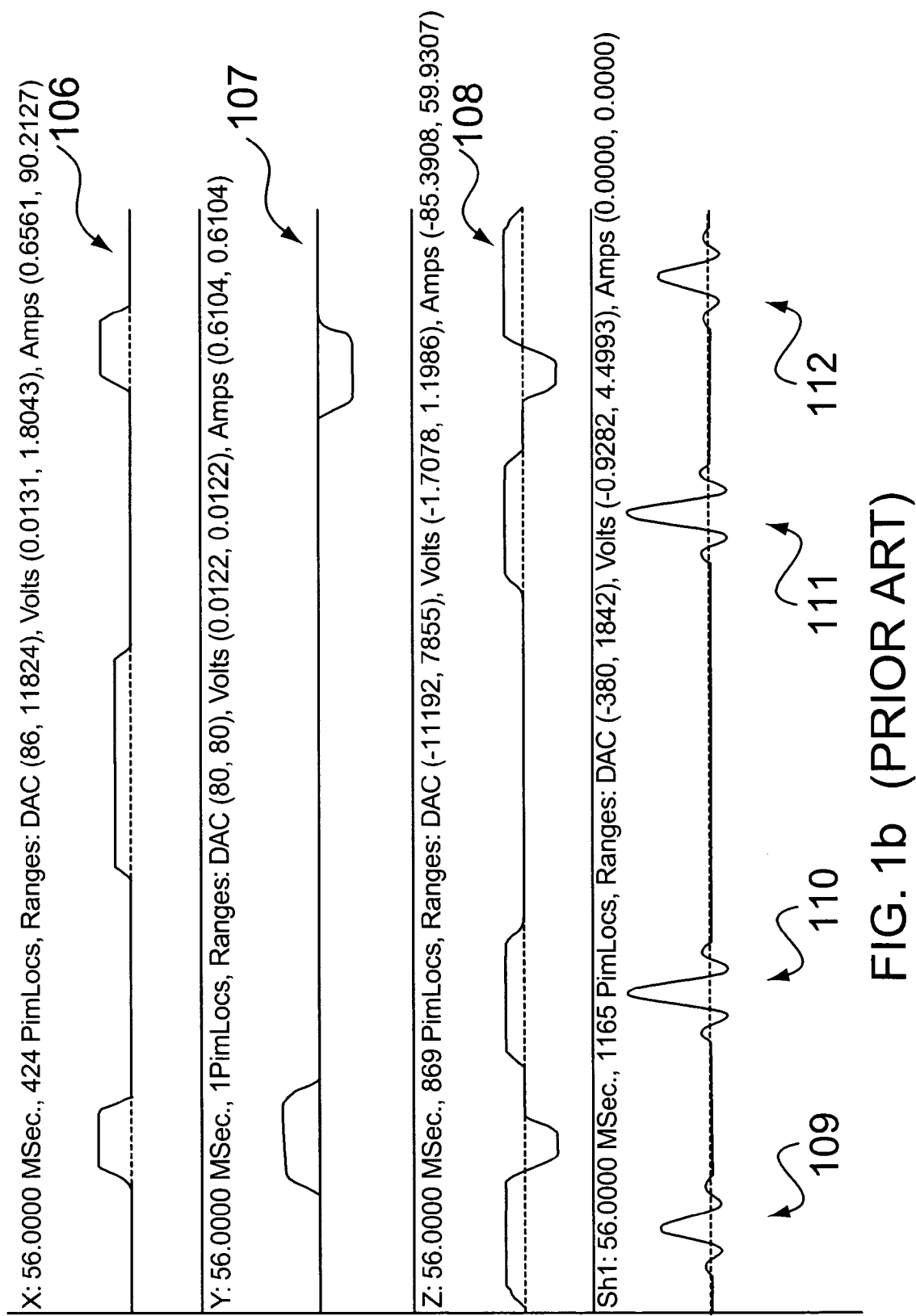
FIG. 1b shows the timed application of a conventional driven equilibrium MRI scheme.

A conventional driven equilibrium imaging pulse sequence is shown in FIG. 1b. As shown, the sequence includes X, Y, and Z gradients 106, 107, 108, 90-degree RF pulses 109, 112, and 180-degree RF pulses 110, 111. All the details related to this technique have been described, for example, by van Uijen and den Boef, "Driven-Equilibrium Radiofrequency Pulses in NMR Imaging," *Magnetic Resonance in Medicine* 1, 502–507 (1984), which description is incorporated herein by reference. Even though there are two 180-degree pulses 110, 111, only the echo following the first 180-degree pulse 110 is used for image reconstruction. A second spin echo is refocused exactly at the center of the second 90-degree pulse 112. This 90-degree RF pulse 112, applied with proper phase, turns the magnetization to the equilibrium direction.

Figure 2:
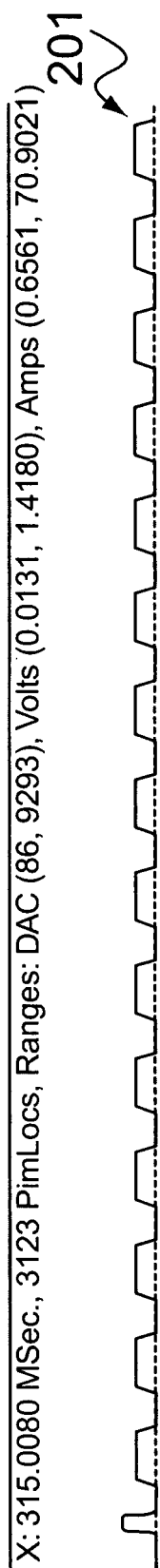
FIG. 2 shows the conventional fast-spin echo MRI scheme.
Figure 2:
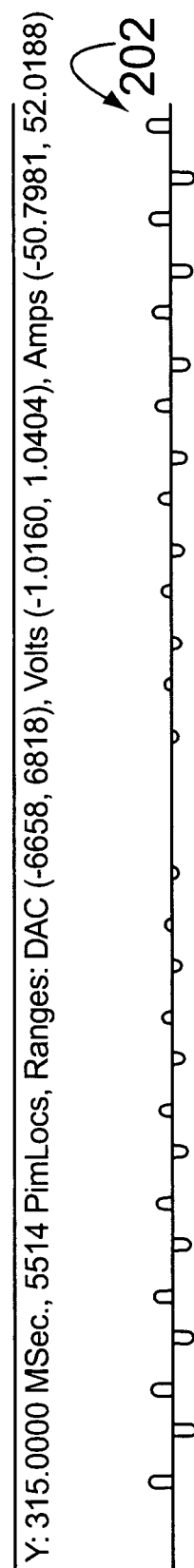
Figure 2:
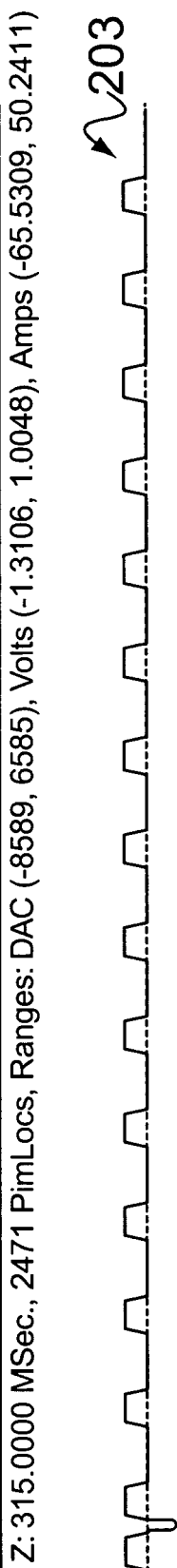
Figure 2:
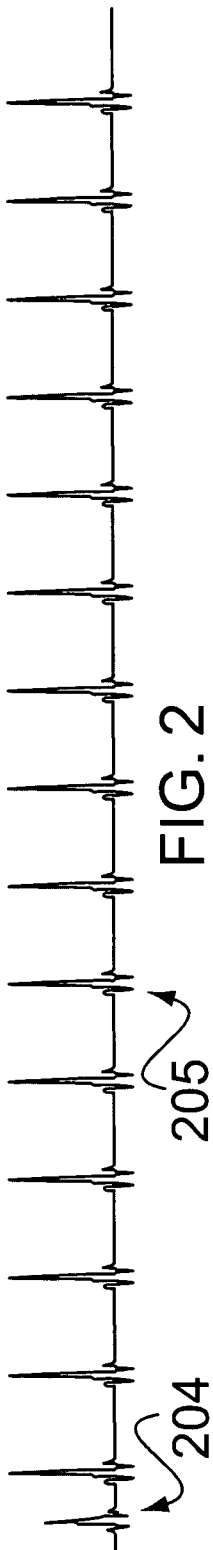

A fast-spin echo sequence is shown in FIG. 2. As :shown, the sequence includes X, Y, and Z gradients 201, 202, 203, a 90-degree RF pulse 204, and a series of 180-degree RF pulses 205. Thus, this pulse sequence has multiple 180-degree refocusing RF pulses, which each generate an echo between adjacent 180-degree pulses. Each of these multiple echoes is then phase- encoded differently, so that the data from each echo fills a different line in $k_x$, $k_y$-space. FIG. 2 shows one exemplary set of phase-encoded levels used in scanning. In this example, there are fifteen 180-degree RF pulses 205 and fifteen echoes following these 180-degree RF pulses. The eighth echo has zero for its phase-encoding amplitude (Y gradient 202). During MRI scanning, each of the phase-encoding amplitudes is stepped so as to generate data from each echo that fills consecutive lines in ($k_x$, $k_y$-space. All the data from these echoes make up the entire k-space data needed to construct an image. Fast spin echo technique is very well described in MRI literature and those skilled in the field of MRI scanning are well aware of its potential. One such advantage is speed, that is, reduction of scan time. Since the entire image is reconstructed from data from all the echoes, the number of echoes during a waiting period determine the number of phase encoded levels acquired in a single waiting period. The number of wait time (TR) repetitions needed to fill k-space is therefore reduced by the number of echoes in the pulse sequence train. For example, for a 256 phase-encoding level scan with a sixteen echo train, only sixteen TRs are needed to collect the data needed to fill a 256×256 k-space. Therefore, the scan time is reduced by a factor equal to the number of echoes in a TR. In a multi-slice scan, the slices are interleaved and the pulse sequence is repeated a number of times that is equal to the number of slices.

According to the present invention, an imaging process utilizing application of both the driven equilibrium technique and a fast- spin echo technique can be used to acquire images faster than is possible using either of the two techniques alone. This process can be used in both single-slice and multiple-slice modes. In the single-slice mode, the slices can be obliqued individually. The speed provided by this process is particularly advantageous because a patient does not have to lie still in the scanner as long as with scanners using conventional processes.

Figure 3:
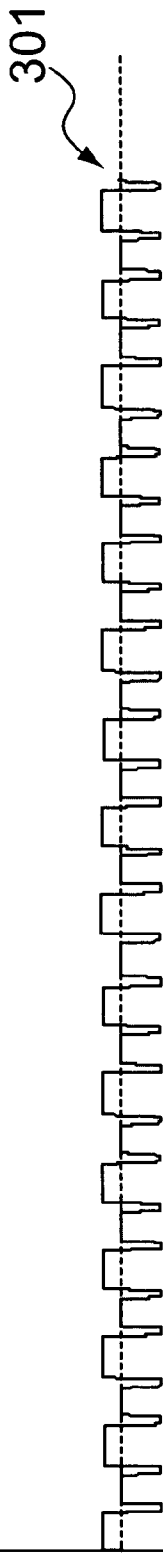
FIG. 3 shows a fast-spin echo imaging pulse sequence applied with driven equilibrium pulses according to the present invention.
Figure 3:
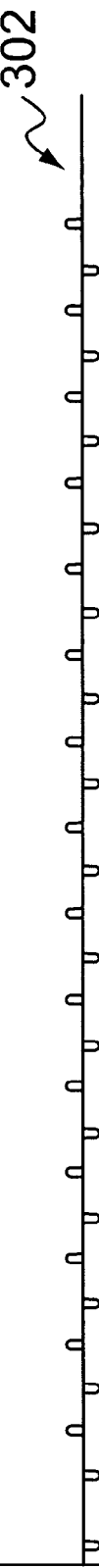
Figure 3:
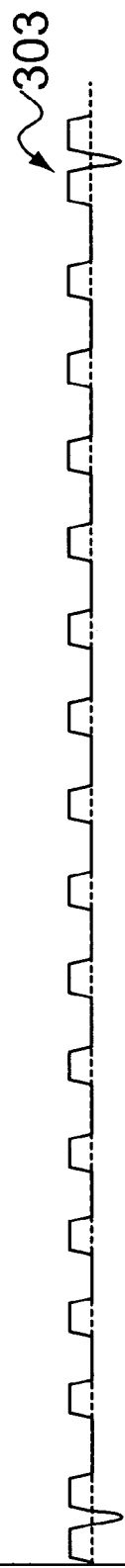
Figure 3:
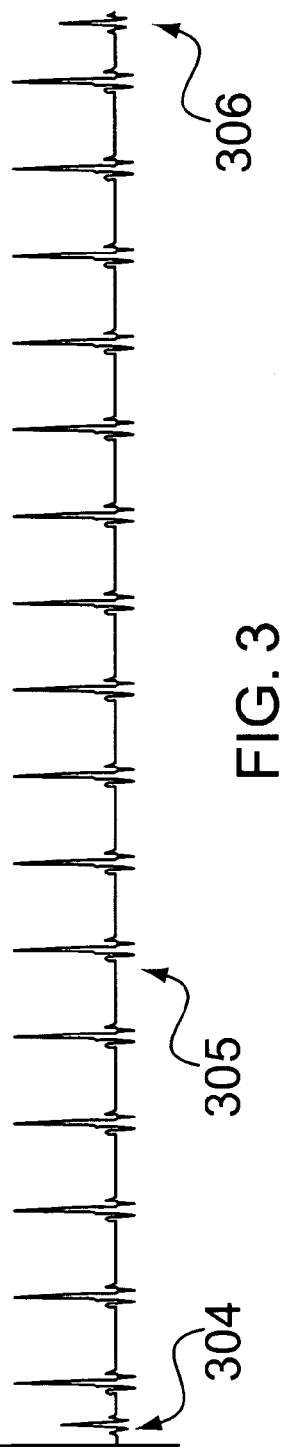

An exemplary driven equilibrium fast-spin echo pulse sequence is shown in FIG. 3. As in the previously described sequence, this sequence includes X, Y, and Z gradients 301, 302, 303, a 90-degree RIP pulse 304, and a series of 180-degree RF pulses 305. A second 90-degree RF pulse 306 with proper RF phase centered on the last spin echo returns the left over magnetization, determined by the signal strength at the center of the last echo, to the initial equilibrium direction parallel to the background static magnetic field direction. The magnetization requires much less time to recover to its full equilibrium strength compared to a standard recovery time, which is usually 5 times the T1 value for a given type of tissue.

In conventional fast-spin echo imaging, the contrast is controlled by collecting the central phase-encoding levels (phase-encoding gradient amplitude close to zero) on the echo of choice. For example, the earlier echoes have greater signal from both short and long T1. However, by adjusting TR, one can control the type of image produced by collecting the central phase-encoding levels on the early echoes. For short TRs, T1 weighted images are obtained, and TRs greater than 5T1 produce proton density images. By keeping TRs long (>5T1) and collecting central levels on later and later echoes, greater and greater T2 contrast is produced. The signal-to-noise ratio also varies with TR and effective TE (time to echo on which central levels are collected). For example, T1 weighted fast-spin echo scans have a lower signal-to-noise ratio than proton density images, and T2 weighted images have greater signal-to-noise ratios in longer T2 tissues than in shorter T2 tissues.

Driven equilibrium fast-spin echo, on the other hand, achieves the same signal-to-noise ratio as scans having a TR equal to 5T1. Contrast in the image can be controlled in the same way as it is for conventional fast-spin echo. In addition, greater T1 weighting may be obtained by returning the signal from earlier echoes to the equilibrium direction. While driven equilibrium fast-spin echo and single TR fast-spin echo scans may take approximately same time, the signal-to-noise ratio is much greater using driven equilibrium fast-spin echo than it is using single TR fast-spin echo. This is because the later echoes in a single TR fast-spin echo sequence have more noise than signal, and therefore reduce the overall signal-to-noise ratio in the image. This is also true for 3D driven equilibrium fast-spin echo scans. The shorter scan time and higher signal-to-noise ratio of driven equilibrium fast-spin echo scans is beneficial in scanning patients with greater anxiety and claustrophobia and in region sensitive to motion, such as c-spine and abdominal areas. The fast single slice capability is particularly useful when rotation or angulation of slice is necessary to capture the correct anatomy of choice. The speed of driven equilibrium fast-spin echo can achieve the same result with better signal-to-noise ratio in multiple single slice scans.

Driven equilibrium fast-spin echo, as a single slice technique, can be beneficial in may ways in scanning different types of patients, in addition to being faster than conventional fast-spin echo techniques. The high speed of single slice driven equilibrium fast-spin echo can be compared to single shot ordinary projection X-ray radiograph. The radiographic images are produced immediately, slice by slice, in a cooperative environment between the patient and the scanner operator. This mode of operation can significantly enhance the effectiveness of the scanner utility. It is particularly useful in stand up MRI systems, where patients have to stand on their feet without moving from the beginning until the end of the scan. In a single slice driven equilibrium fast-spin echo patient/operator cooperative environment, patients simply walk inside the scanner space, hold one or more handle bars, and stay still only during a single slice acquisition period. This minimizes patient loading time and time lost due to poor quality scanning.

There are two ways of running the single slice mode. In the first mode of operation, the region of interest is placed in the center of the magnet and imaged using driven equilibrium fast-spin echo. After that slice is imaged, the patient bed is moved to position the next region of interest in the center of the magnet, and that region is imaged as before. By following this procedure, the Larmor frequency remains constant, that is, it is not changed to excite different slices. This mode of operation significantly reduces the stringent and harder to achieve specification requirements of a whole body scanner. Accordingly, this can reduce the cost of the MRI scanners themselves, and make it more affordable for a larger percentage of the population to undergo MRI diagnosis. This mode of operation could be called the CAT Scan mode of operation because of the similarity of operation of the two diagnostic modalities. According to the present invention, use of this mode does not limit the operator to axial plane imaging only; coronal plane imaging, for example, may be obtained by tilting the bed and the gantry. In other applications, the main magnetic field can be suitably reconfigured to image other planes.

In the second single-slice mode of operation, the conventional whole body magnet space may be used either for volumetric driven equilibrium fast-spin echo or repeated single slice imaging with driven equilibrium fast-spin echo. In this case, the Larmor frequency is adjusted to match the slice select gradient and the position of the next region of interest. This may be repeated until all the required slices are acquired. In the volumetric or 3D acquisition mode, the conventional stepping second phase-encoding gradient is used along the slice/slab selection direction. A 3D Fourier Transform (3DFT) is used to reconstruct the final images.

In both modes of operation, individual slices or slabs may be oriented to image the anatomy of interest. Imaging the multiple signal slices with their respective individual slice orientations is particularly useful in obtaining both T1 weighted and T2-weighted images with greater speed and accuracy.

Driven equilibrium fast-spin echo can also be used as a simultaneous multiple slice imaging technique. In a conventional multi-slice imaging process, the waiting period between excitation and acquisition of a slice from one region of interest is used excite and acquire other slices from different regions of interest. Using a driven equilibrium fast-spin echo technique, this waiting period is reduced significantly, leaving no room for other slices to be taken. Therefore, a simultaneous multi-slice excitation and acquisition technique is more advantageous using the process of the present invention. The conventional simultaneous multi slice acquisition technique is very well known to those skilled in the art of MRI scanning. The speed and utility of driven equilibrium fast-spin echo extends the range of application of the simultaneous multi-slice acquisition technique, and makes it more useful for applications to which the conventional technique applies.

Only one frequency is used for excitation in acquiring the NMR signal in the single slice mode. Gradients are adjusted for oblique scanning. Once that slice is completely acquired, the NMR frequency and the gradient are adjusted to acquire an image from a different region with a second oblique angle. The greater speed of single slice acquisition is beneficial to the patient, who can relax between slices.

In the multislice acquisition mode, RF phases of different slices are different from one another and the final images can be constructed either by sharing the Kg space or by using a third fast Fourier transform to separate the slices. All the slices have the same oblique angle.

Thus, in general, the fast-spin echo technique utilized is essentially a multiecho NMR imaging sequence, where different echoes are encoded differently to fill the $(k_x, k_g)$ space at a speed of 1/n of the single echo speed, where n is the number of echoes in the multiecho sequence. During this echo train, a 90-degree RF pulse applied with proper phase at the center of any echo turns the magnetization back in the direction of the static magnetic field. The amount of returned magnetization is a function of how late in the echo train the 90-degree RF pulse is applied. Within a short waiting time after the 90-degree RF pulse, the spins are ready to be excited again. The substantial reduction in the waiting time TR results in faster scans, and in the single slice mode, the scans can be obliqued to fit the anatomy of choice.

To summarize, a general multi-echo sequence has one 90-degree RF pulse in the beginning, followed by a series of 180-degree RF pulses. If there are n 180-degree pulses, then n echoes follow those 180-degree pulses. A second 90-degree RF pulse is turned on exactly at the center of the nth echo, which returns all the magnetization left at this time to the static field direction. All the gradients used in imaging have to satisfy the standard integral condition up to the center or the second 90-degree pulse. Careful adjustment of integral conditions minimizes loss of signal-to-noise ratio.

A driven equilibrium fast-spin echo technique therefore overcomes the shortcomings of both conventional fast-spin echo techniques and driven equilibrium methods, resulting in greater signal-to-noise ratio, scanning speed, and contrast control. The process of the present invention provides both single slice and multiple slice capabilities, and allows for individual slice orientation and simultaneous multiple slice scanning. Proper utilization of the technique reduces demand on the magnet, at least in part by reducing the required gradient power, resulting in less expensive scanner hardware and a more cost-effective scanning process. The utility and efficiency of particular MRI procedures, such as stand- up image scanning, are enhanced. While these improvements and advantages are certainly noteworthy, it is important to recognize that 3D Fourier transform spin echo scanning techniques are only possible using the process of the present invention, and are not even contemplated through the use of conventional spin-echo scanning processes.

The present invention has been described by way of example and in terms of preferred embodiments. However, it is to be understood that the present invention is not strictly limited to the particularly disclosed embodiments. To the contrary, various modifications, as well as similar arrangements, are included within the spirit and scope of the present invention. The scope of the appended claims, therefore, should be accorded the broadest possible interpretation so as to encompass all such modifications and similar arrangements.

What is claimed is:

1. A method of performing a magnetic resonance scan sequence to modify image contrast, comprising:
   choosing an imaging pulse sequence, wherein the repetition time of said pulse sequence is variable, and setting a value for the variable repetition time that provides a desired image contrast;
   selecting a number of image slices to cover an anatomical region of an imaging object to be scanned, wherein the selected number of image slices is greater than the number of slices that can be provided by the set pulse sequence repetition time;
   acquiring image data for a subset of the selected number of image slices at the set pulse sequence repetition time, wherein the subset includes at least one slice; and
   automatically acquiring data for another subset of the selected number of image slices at the set pulse sequence repetition time, wherein the another subset includes at least one slice.

2. The method of claim 1, wherein the imaging object is a human being oriented substantially upright during the magnetic resonance scan sequence.

3. The method of claim 1, wherein the desired image contrast is an image contrast that falls within a predetermined desired range of image contrast values.

4. The method of claim 1, wherein automatically acquiring data for another subset of the selected number of image slices includes sequentially acquiring data for a plurality of subsets of the selected number of image slices, such that the data acquired for all of the plurality of subsets includes data corresponding to all of the selected number of image slices.

5. The method of claim 1, wherein acquiring image data includes
   subjecting the imaging object to a uniform polarizing magnetic field,
   applying magnetic field gradients to the imaging object,
   applying RF energy to the imaging object according to a fast-spin echo technique, and
   applying an imaging sequence that produces T1-weighted images.

6. The method of claim 1, wherein acquiring image data includes subjecting the imaging object to a uniform polarizing magnetic field,
applying magnetic field gradients to the imaging object, and
applying RF energy to the imaging object according to a fast spin echo technique,
wherein the fast-spin echo technique includes applying an imaging sequence that produces T1-weighted images.

7. The method of claim 6, further comprising collecting central phase-encoding levels on early echoes of the imaging sequence;
wherein a repetition wait time of the fast-spin echo technique is less than about 5T1.

8. The method of claim 1, wherein acquiring image data includes
subjecting the imaging object to a uniform polarizing magnetic field,
applying magnetic field gradients to the imaging object,
applying RF energy to the imaging object according to a fast-spin echo technique, and
applying an imaging sequence that produces T2-weighted images.

9. The method of claim 1, wherein acquiring image data includes
subjecting the imaging object to a uniform polarizing magnetic field,
applying magnetic field gradients to the imaging object, and
applying RF energy to the imaging object according to a fast-spin echo technique,
wherein the fast-spin echo technique includes applying an imaging sequence that produces T2-weighted images.

10. The method of claim 9, further comprising collecting central phase-encoding levels on late echoes of the imaging sequence;
wherein a repetition wait time of the fast-spin echo technique is greater than about 5T1.

11. The method of claim 1, wherein acquiring image data includes
subjecting the imaging object to a uniform polarizing magnetic field,
applying magnetic field gradients to the imaging object,
applying RF energy to the imaging object according to a fast-spin echo technique, and
applying an imaging sequence that produces proton density images.

12. The method of claim 1, wherein acquiring image data includes
subjecting the imaging object to a uniform polarizing magnetic field,
applying magnetic field gradients to the imaging object, and
applying RF energy to the imaging object according to a fast-spin echo technique,
wherein the fast-spin echo technique includes applying an imaging sequence that produces proton density images.

13. The method of claim 12, further comprising collecting central phase-encoding levels on early echoes of the imaging sequence;
wherein a repetition wait time of the fast-spin echo technique is greater then about 5T1.

14. The method of claim 1, wherein acquiring image data includes
subjecting the imaging object to a uniform polarizing magnetic field,
applying magnetic field gradients to the imaging object,
applying RF energy to the imaging object according to a fast-spin echo technique, and
subsequently applying RF energy to the imaging object according to a driven equilibrium technique.

15. The method of claim 14, wherein the imaging object is a human being, and the uniform polarizing magnetic field is produced by a magnetic resonance imaging system, a wherein the human being is oriented substantially upright within the uniform polarizing magnetic field.

16. The method of claim 14, wherein the fast-spin echo technique includes applying an imaging sequence that produces T2-weighted images.

17. The method of claim 16, further comprising collecting central phase-encoding levels on late echoes of the imaging sequence;
wherein a repetition wait time of the fast-spin echo technique is greater than about 5T1.

18. The method of claim 14, wherein the fast-spin echo technique includes applying an imaging sequence that produces proton density images.

19. The method of claim 18, further comprising collecting central phase-encoding levels on early echoes of the imaging sequence;
wherein a repetition wait time of the fast-spin echo technique is greater than about 5T1.

20. The method of claim 14, wherein the fast-spin echo technique includes applying a multi-echo NMR imaging sequence.

21. The method of claim 20, wherein the multi-echo NMR imaging sequence includes a plurality of different echoes, and wherein each of the plurality of different echoes encoded differently.

22. The method of claim 20, wherein the multi-echo NMR imaging sequence includes a plurality of different echoes, and wherein at least one of the plurality of different echoes is encoded differently than another one of the plurality of different echoes.

23. The method of claim 20, further comprising applying a 90-degree RF pulse at the center of any of the plurality of different echoes.

24. The method of claim 23, wherein the applied 90-degree RF pulse has a phase such that magnetization of the imaging object is forced in the direction of the uniform polarizing magnetic field.

25. The method of claim 20, wherein the multi-echo NMR imaging sequence includes a first 90-degree RF pulse followed by a series of 180-degree RF pulses.

26. The method of claim 25, wherein the series of 180-degree RF pulses includes n 180-degree pulses, which are followed by n echoes.

27. The method of claim 26, further comprising applying a second 90-degree RF pulse at a center of the nth echo, such that magnetization of the imaging object is oriented in the direction of the uniform polarizing magnetic field.

28. The method of claim 1, wherein acquiring image data includes
subjecting the imaging object to a uniform polarizing magnetic field,
applying magnetic field gradients to the imaging object,
applying a first 90-degree RF excitation pulse,
applying a sequence of 180-degree RF excitation pulses following the first 90-degree RF excitation pulse, and
applying a second 90-degree RF excitation pulse following the sequence of 180-degree RF excitation pulses,
wherein each said 180-degree RF excitation pulse in the sequence generates a spin echo, and wherein at least one said spin echo is encoded differently than another said spin echo.

29. The method of claim 28, further comprising:
detecting a nuclear magnetic resonance signal emitted by the imaging object; and
processing the nuclear magnetic resonance signal to provide imaging data.

30. The method of claim 29, wherein the first 90-degree RF excitation pulse corresponds to the angular precession frequency for a selected plane of the imaging object.

31. The method of claim 30, further comprising, after providing the imaging data, moving the imaging object and applying the first 90-degree RF excitation pulse corresponding to the same angular precession frequency, to select a different plane of the imaging object.

32. The method of claim 30, further comprising, after providing the imaging data, applying the first 90-degree RF excitation pulse corresponding to a different angular precession frequency, to select a respective different plane of the imaging object, without moving the imaging object.

33. The method of claim 28, wherein each said spin echo precedes a next 180-degree RF excitation pulse in the sequence.

34. The method of claim 28, wherein the second 90-degree RF excitation pulse is applied at a center of the spin echo generated by a last 180-degree RF excitation pulse in the sequence.

35. The method of claim 28, wherein each said spin echo is encoded differently.

36. The method of claim 35, wherein
each said spin echo is encoded by one or more of the magnetic field gradients; and
the one or more magnetic field gradients that encodes the spin echoes is stepped to amplitude to encode each said spin echo differently.

37. The method of claim 36, wherein the one or more magnetic field gradients that encodes the spin echoes is stepped in amplitude to generate data from each said spin echo to fill respective different lines in three-dimensional k-space.

38. The method of claim 37, wherein all the data generated from the spin echoes fills the entire three-dimensional k-space so that an image of the imaging object can be constructed from the data.

39. The method of claim 37, wherein the different lines in three-dimensional k-space are consecutive lines in three-dimensional k-space.

40. The method of claim 28, wherein the second 90-degree RF excitation pulse has a phase such that magnetization of the imaging object is forced in the direction of the uniform polarizing magnetic field.

41. The method of claim 28, wherein the imaging object is a human being, and the uniform polarizing magnetic field is produced by a magnetic resonance imaging system, wherein the human being is oriented substantially upright within the uniform polarizing magnetic field.

42. The method of claim 1, wherein acquiring image data includes
subjecting the imaging object to a uniform polarizing magnetic field,
applying magnetic field gradients to the imaging object,
applying RF energy to the imaging object according to a fast-spin echo technique,
subsequently applying RF energy to the imaging object according to a driven equilibrium technique,
detecting a nuclear magnetic resonance signal emitted by the imaging object, and
processing the nuclear magnetic resonance signal to provide imaging data,
wherein applying RF energy to the imaging object according to a fast-spin echo technique includes applying an RF pulse corresponding to the angular precession frequency for a selected plane of the imaging object.

43. The method of claim 42, further comprising, after providing the imaging data, moving the imaging object and applying an RF pulse corresponding to the same angular precession frequency, to select a different plane of the imaging object.

44. The method of claim 42, other comprising, after providing the imaging data, applying an RF pulse corresponding to a different angular precession frequency, to select a respective different plane of the imaging object, without moving the imaging object.

45. A magnetic resonance scan system, comprising:
an imaging pulse sequence generator that generates a pulse sequence having a repetition time, that is variable and settable by a user to a value that provides a desired image contrast;
sets of conductors that carry electrical current and that are distributed to produce orthogonal magnetic field gradients that isolate image slices to cover an anatomical region of an imaging object to be scanned;
a controller that selects a number of image slices to cover the anatomical region of the imaging object to be scanned, wherein the selected number of image slices is greater than the number of slices that can be provided by the pulse sequence repetition time set by the user; and
image data acquisition apparatus that acquires image data for a subset of the selected number of image slices as at the set pulse sequence repetition time, wherein the subset includes at least one slice, and automatically acquires data for another subset of the selected number of image slices at the act pulse sequence repetition time, wherein the another subset includes at least one slice.

46. The system of claim 45, wherein, the desired image contrast is an image contrast that falls within a predetermined desired range of image contrast values.

47. The system of claim 45, wherein the image data acquisition apparatus is adapted to sequentially acquire data for a plurality of subsets of the selected number of image slices, such that the data acquired for all of the plurality of subsets includes data corresponding to all of the selected number of image slices.

48. The system of claim 45, wherein the image data acquisition apparatus is adapted to subject the imaging object to a uniform polarizing magnetic field, apply RF energy to the imaging object according to a fast-spin echo technique, and subsequently applying RF energy to the imaging object according to a driven equilibrium technique.

49. The system of claim 48, wherein the uniform polarizing magnetic field is produced an imaging space adapted for accommodating a human being oriented in a substantially upright position.

50. The system of claim 49, wherein the imaging space is adapted for accommodating a human being oriented in a standing position.

51. The system of claim 48, wherein the fast-spin echo technique includes a multi-echo NMR imaging sequence.

52. The system of claim 48, wherein the fast-spin echo technique includes an imaging sequence that produces T1-weighted images.

53. The system of claim 52, wherein the image data acquisition apparatus is adapted to collect central phase-encoding levels on early echoes of the imaging; sequence, and to set a repetition wait time of the fast-spin echo technique to less than about 5T1.

54. The system of claim 48, wherein the fast-spin echo technique includes an imaging sequence that produces T2-weighted images.

55. The system of claim 54, wherein the image data acquisition apparatus is adapted to collect central phase-encoding levels on late echoes of the imaging sequence, and to set a repetition wait time of the fast-spin echo technique to greater than about 5T1.

56. The system of claim 48, wherein the fast-spin echo technique includes an imaging sequence that produces proton density images.

57. The system of claim 56, wherein the image data acquisition apparatus is adapt to collect central phase-encoding levels on early echoes of the imaging; sequence, and to set a repetition wait time of the fast-spin echo technique to greater than about 5T1.

58. An NMR imaging process, comprising:
subjecting the imaging object to a uniform polarizing magnetic field;
applying magnetic field gradients to the imaging object;
applying RF energy to the imaging object according to a fast-spin echo technique;
subsequently applying RF energy to the imaging object according to a driven equilibrium technique; and
applying a 90-degree RF pulse at the center of any of the plurality of different echoes;
wherein the fast-spin echo technique includes application of a multi-echo NMR imaging sequence; and
wherein the applied 90-degree RF pulse has a phase such that magnetization of the imaging object is forced in the direction of the uniform polarizing magnetic field.

59. The process of claim 58, wherein the multi-echo NMR imaging sequence includes a plurality of different echoes, and wherein each of the plurality of different echoes is encoded differently.

60. The process of claim 58, wherein the multi-echo NMR imaging sequence includes a plurality of different echoes, and wherein at least one of the plurality of different echoes is encoded differently than another one of the plurality of different echoes.

61. The precess of claim 58, wherein the imaging object is a human being, and the uniform polarizing magnetic field is produced by a magnetic resonance imaging system, wherein the human being stands upright within the uniform polarizing magnetic field.

62. An NMR imaging process, comprising:
subjecting imaging object to a uniform polarizing magnetic field;
applying magnetic field gradients to the imaging object;
applying RF energy to the imaging object according to a last-spin echo technique; and
subsequently applying RF energy to the imaging abject according to a driven equilibrium technique;
wherein the fast-spin echo technique includes application of a multi-echo NMR imaging sequence;
wherein the multi-echo NMR imaging sequence includes a first 90-degree RF pulse followed by a series of 180-degree RF pulses; and
wherein the series of 180-degree RF pulses includes n 180-degree pulses, which are followed by n echoes.

63. The process of claim 62, further comprising applying a second 90-degree RF pulse at a center of the nth echo, such that magnetization of the imaging object is oriented in the direction of the uniform polarizing magnetic field.

64. The processes of claim 62, wherein the multi-echo NMR imaging sequence includes a plurality of different echoes, and wherein each of the plurality of different echoes is encoded differently.

65. The process of claim 62, wherein the multi-echo NMR imaging sequence includes a plurality of different echoes, and wherein at least one of the plurality of different echoes is encoded differently than another one of the plurality of different echoes.

66. The process as of claim 62, wherein the imaging object is a human being, and the uniform polarizing magnetic field is produced by a magnetic resonance imaging system, wherein the human being stands upright within the uniform polarizing magnetic field.

67. An NMR imaging process, comprising:
subjecting the imaging object to a uniform polarizing magnetic field;
applying magnetic field gradients to the imaging object;
applying RF energy to the imaging object according to a fast-spin echo technique, including applying an RF pulse corresponding to the angular precession frequency for a selected plane of the imaging object;
subsequently applying RF energy to the imagine object according to a driven equilibrium technique;
detecting a nuclear magnetic resonance signal emitted by the imaging object;
processing the nuclear magnetic resonance signal to provideimaging data; and
after providing the imaging data, moving the imaging object and applying an RF pulse corresponding to the same angular precession frequency, to select a different plane of the imaging object.

68. The process of claim 67, wherein the imaging object is a human being, and the uniform polarizing magnetic field is produced by a magnetic resonance imaging system, wherein the human being stands upright within the uniform polarizing magnetic field.

69. An NMR imaging process, comprising:
subjecting the imaging object to a uniform polarizing magnetic field;
applying magnetic field gradients to the imaging object;
applying RF energy to the imaging object according to a fast-spin echo technique, including applying an RF pulse corresponding to the angular precession frequency for a selected plane of the imaging object;
subsequently applying RF energy to the imaging object according to a driven equilibrium technique;
detecting a nuclear magnetic resonance signal emitted by the imaging object;
processing the nuclear magnetic resonance signal to provide imaging data; and
after providing the imaging data, applying an RF pulse corresponding to a different angular precession frequency, to select a respective different plane 70. The process of claim 69, wherein the imaging object is a human being, and the uniform polarizing magnetic field is produced by a magnetic resonance imaging system, wherein the human being stands upright within the uniform polarizing magnetic field.

* * * * *